(12) United States Patent
Chou et al.

(10) Patent No.: US 12,471,426 B2
(45) Date of Patent: Nov. 11, 2025

(54) MICRO ELEMENT STRUCTURE AND DISPLAY DEVICE

(71) Applicant: PlayNitride Display Co., Ltd., MiaoLi County (TW)

(72) Inventors: Yun-Syuan Chou, MiaoLi County (TW); Chee-Yun Low, MiaoLi County (TW); Pai-Yang Tsai, MiaoLi County (TW); Fei-Hong Chen, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 448 days.

(21) Appl. No.: 18/085,530

(22) Filed: Dec. 20, 2022

(65) Prior Publication Data
US 2023/0343912 A1 Oct. 26, 2023

(30) Foreign Application Priority Data

Apr. 25, 2022 (TW) .................................. 111115561
Dec. 5, 2022 (TW) .................................. 111146481

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H10H 20/831* (2025.01);
(Continued)

(58) Field of Classification Search
CPC ...... H10H 29/24; H10H 29/20; H10H 29/832; H10H 29/45; H10H 29/032;
(Continued)

(56) References Cited

U.S. PATENT DOCUMENTS 10,205,057 B2 * 2/2019 He .................... H10H 20/856
2016/0020353 A1 1/2016 Chu
(Continued)

FOREIGN PATENT DOCUMENTS

CN 105489727 4/2016
CN 105895792 8/2016
(Continued)

OTHER PUBLICATIONS

"Office Action of Taiwan Counterpart Application", issued on Aug. 16, 2023, p. 1-p. 7.
(Continued)

*Primary Examiner* — Jose R Diaz
(74) *Attorney, Agent, or Firm* — JCIPRNET

(57) ABSTRACT

A micro element structure including a body, two electrodes, two solder patterns and a confinement structure is provided. The two electrodes are disposed on a side of the body. The two solder patterns are disposed on the two electrodes, respectively. The confinement structure protrudes relative to the body, wherein the confinement structure surrounds one of the electrodes and the solder pattern thereon, and at least a portion of the confinement structure is separated from the surrounded solder pattern with a gap. A display device is also provided.

16 Claims, 8 Drawing Sheets

(51) Int. Cl.
  *H10H 20/831* (2025.01)
  *H10H 20/832* (2025.01)
  *H10H 20/84* (2025.01)
(52) U.S. Cl.
  CPC ........ *H10H 20/8312* (2025.01); *H10H 20/84* (2025.01); *H10H 20/832* (2025.01)
(58) Field of Classification Search
  CPC .. H10H 29/0364; H10H 20/85; H10H 20/857; H10H 20/831; H10H 20/83; H10H 20/8312
  See application file for complete search history.

(56) References Cited

U.S. PATENT DOCUMENTS

2018/0240950 A1   8/2018   Jang et al.
2018/0261729 A1   9/2018   Huang et al.

FOREIGN PATENT DOCUMENTS

| | | |
|---|---|---|
| CN | 212136469 | 12/2020 |
| CN | 212725367 | 3/2021 |
| KR | 20150000108 | 1/2015 |
| TW | 201543716 | 11/2015 |
| TW | 201801341 | 1/2018 |
| TW | I698994 | 7/2020 |
| TW | 202141779 | 11/2021 |

OTHER PUBLICATIONS

"Office Action of Korea Counterpart Application", issued on May 9, 2025, p. 1-p. 8.

"Office Action of China Counterpart Application", issued on Jun. 6, 2025, p. 1-p. 7.

* cited by examiner

MICRO ELEMENT STRUCTURE AND DISPLAY DEVICE

CROSS-REFERENCE TO RELATED APPLICATION

This application claims the priority benefits of Taiwanese application no. 111115561, filed on Apr. 25, 2022, and Taiwanese application no. 111146481, filed on Dec. 5, 2022. The entirety of each of the above-mentioned patent applications is hereby incorporated by reference herein and made a part of this specification.

BACKGROUND

Technical Field

The disclosure relates to a micro element structure and a display device.

Description of Related Art

When bonding the an electronic element to a circuit substrate, a solder material as a medium is essential. For example, a reflow process is commonly performed in bonding technique. However, since the solder material may be temporarily melted to cause overflow during the process, particularly for extremely small-sized micro element structures, it is likely to result in short circuits in electrodes or other circuits.

SUMMARY

The disclosure is directed to a micro element structure and a display device, which helps mitigating the short circuit problem caused by solder material overflow.

An embodiment of the disclosure provides a micro element structure including a body, two electrodes, two solder patterns and a confinement structure. The two electrodes are disposed on a side of the body. The two solder patterns are respectively disposed on the two electrodes. The confinement structure protrudes relative to the body, wherein the confinement structure surrounds one of the electrodes and the solder pattern thereon, and at least a portion of the confinement structure is separated from the surrounded solder pattern with a gap.

An embodiment of the disclosure provides a display device including a circuit substrate and a plurality of micro element structures. The micro element structures are disposed on the circuit substrate and are electrically connected to the circuit substrate. Each of the micro element structures includes a body, two electrodes, two solder patterns and a confinement structure. The two electrodes are disposed on a side of the body facing the circuit substrate. The two solder patterns are respectively disposed on the two electrodes and located between the two electrodes and the circuit substrate. The confinement structure protrudes relative to the body, wherein the confinement structure surrounds one of the electrodes and the solder pattern thereon, and at least a portion of the confinement structure is separated from the surrounded solder pattern with a gap.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Directional terminology mentioned in the following embodiments, such as "top," "bottom," "front," "back," "left," "right," etc., is used with reference to the orientation of the FIGS. being described and are not intended to limit the disclosure. Furthermore, an element/film layer being disposed on (or over) another element/film layer may encompass a situation that the element/film layer is disposed directly on (or above) the other element/film layer, and the two elements/film layers are in direct contact; and a situation that the element/film layer is indirectly disposed on (or above) the other element/film layer, and there are one or more elements/film layers between the two elements/film layers.

In the FIGS., each of the drawings depicts typical features of methods, structures, and/or materials used in the particular exemplary embodiments. However, these drawings are not to be interpreted as limiting or limiting the scope or property covered by these exemplary embodiments. For example, for clarity, relative thickness and position of each film layer, region and/or structure may be reduced or enlarged.

Figure 1A:
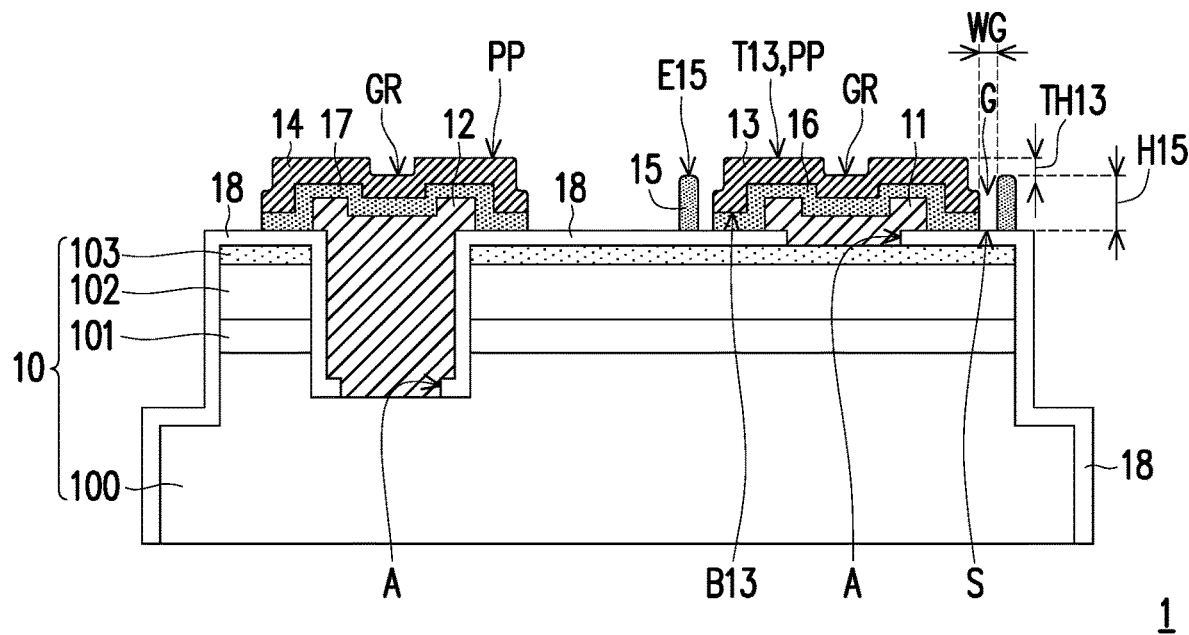
FIG. 1A, FIG. 2A, FIG. 3A and FIG. 4 to FIG. 12 are respectively partial schematic cross-sectional views of micro element structures according to a plurality of embodiments of the disclosure.
Figure 1B:
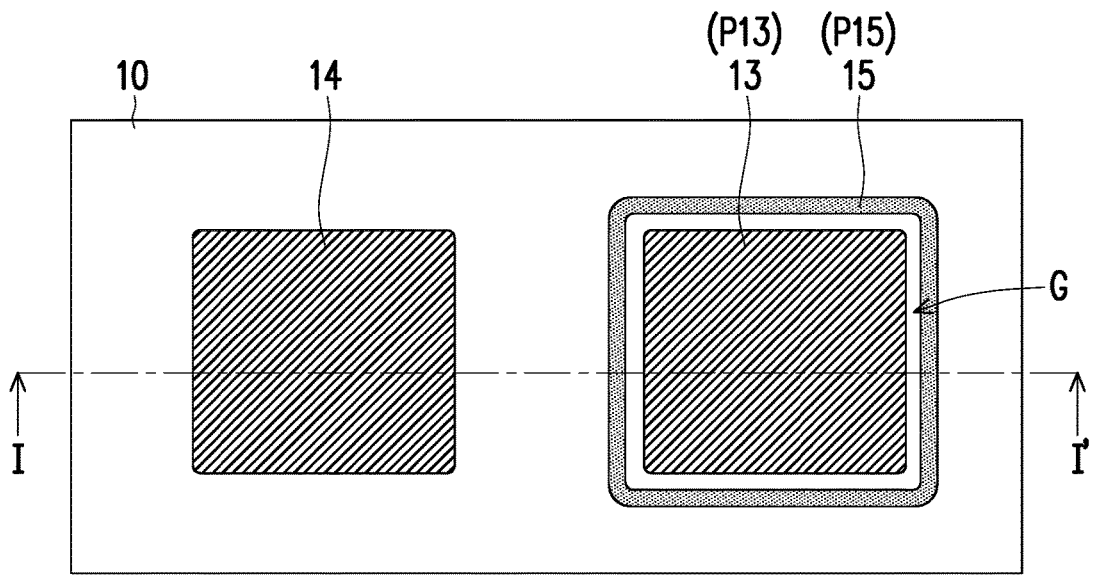
FIG. 1B, FIG. 2B and FIG. 3B are respectively partial schematic top views of the micro element structures according to a plurality of embodiments of the disclosure, where schematic cross-sectional views of FIG. 1B, FIG. 2B and FIG. 3B along a section line I-I', a section line II-II' and a section line III-III' may respectively refer to FIG. 1A, FIG. 2A and FIG. 3A.
Figure 2A:
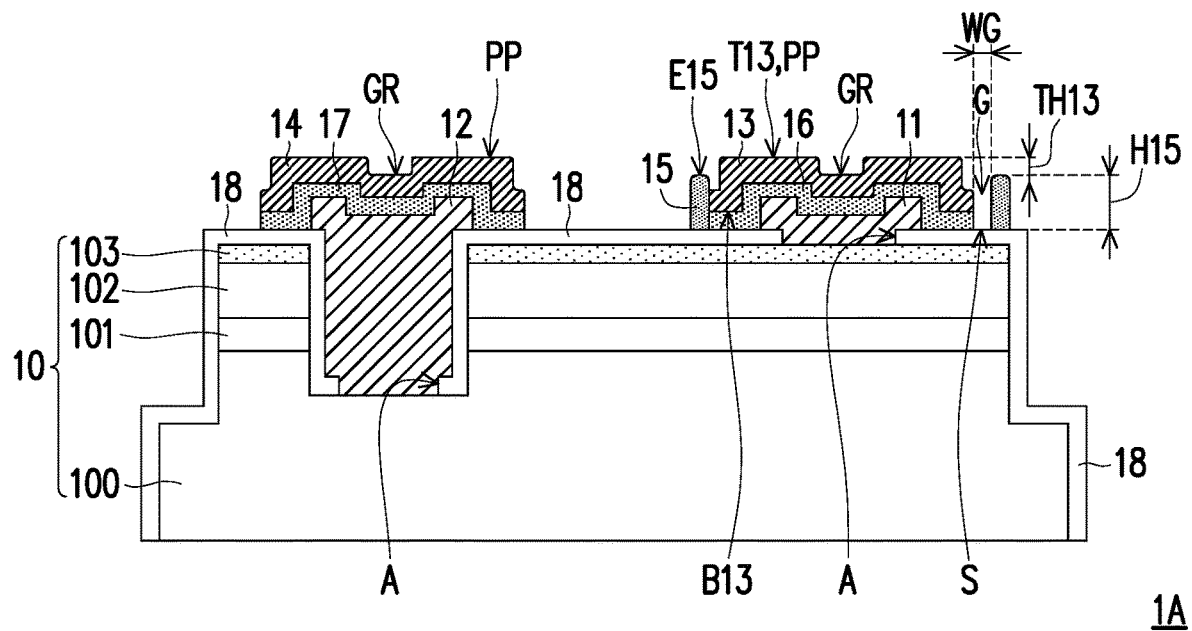
Figure 2B:
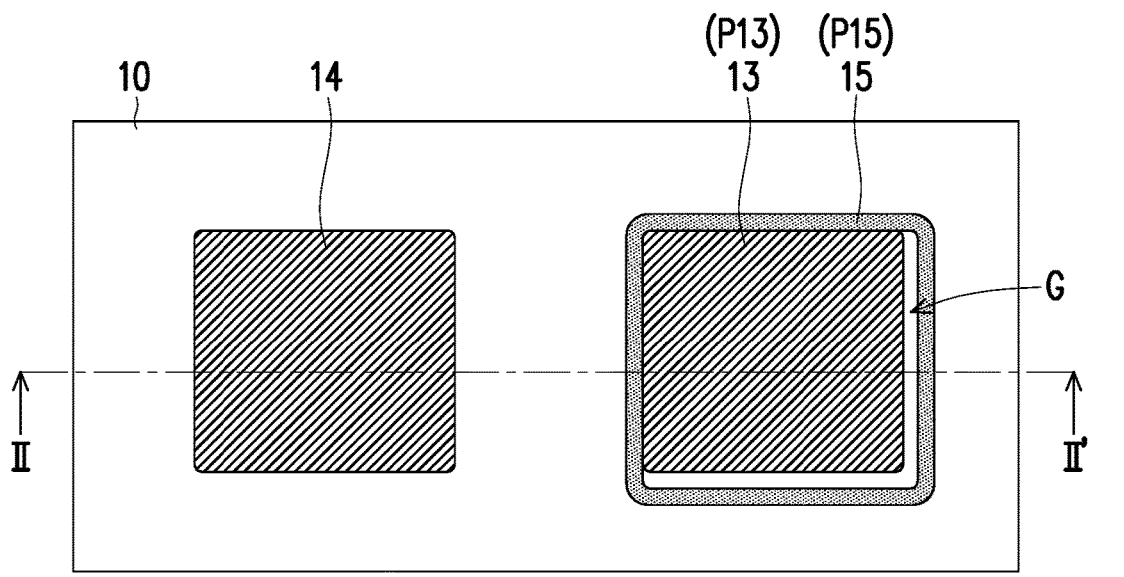
Figure 11:
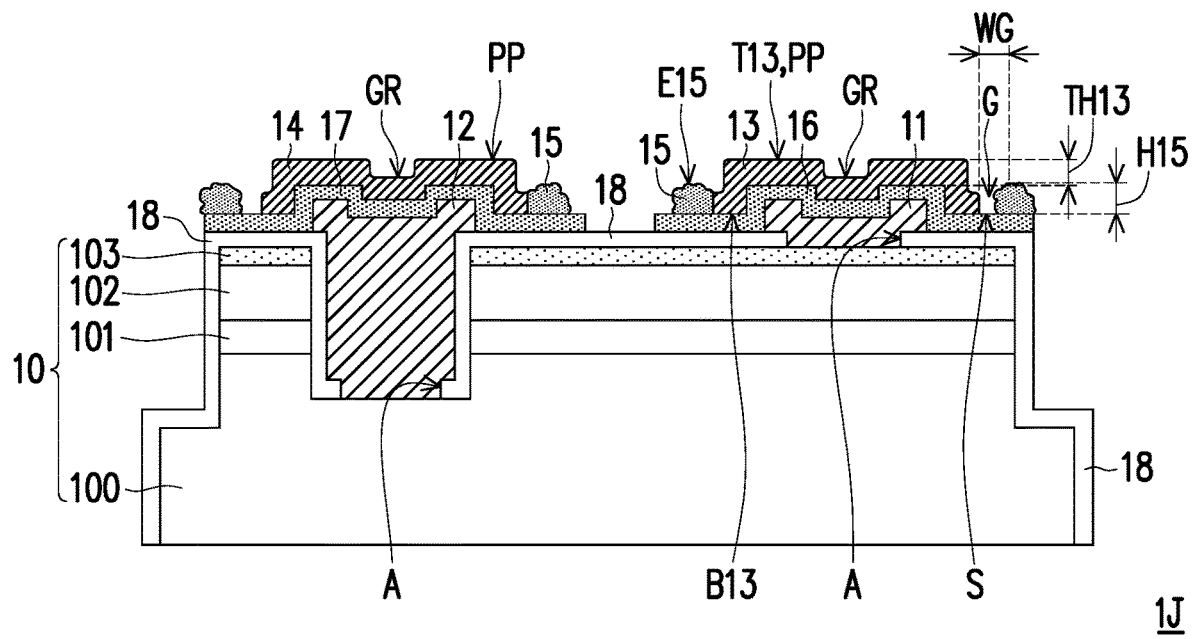
Figure 12:
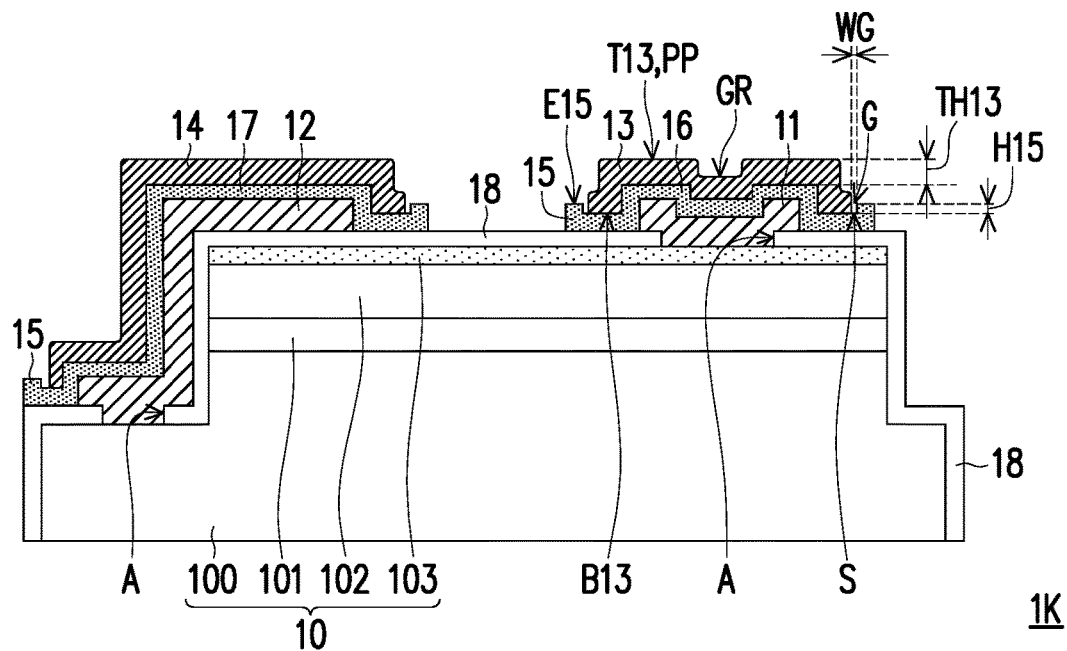
Figure 13:
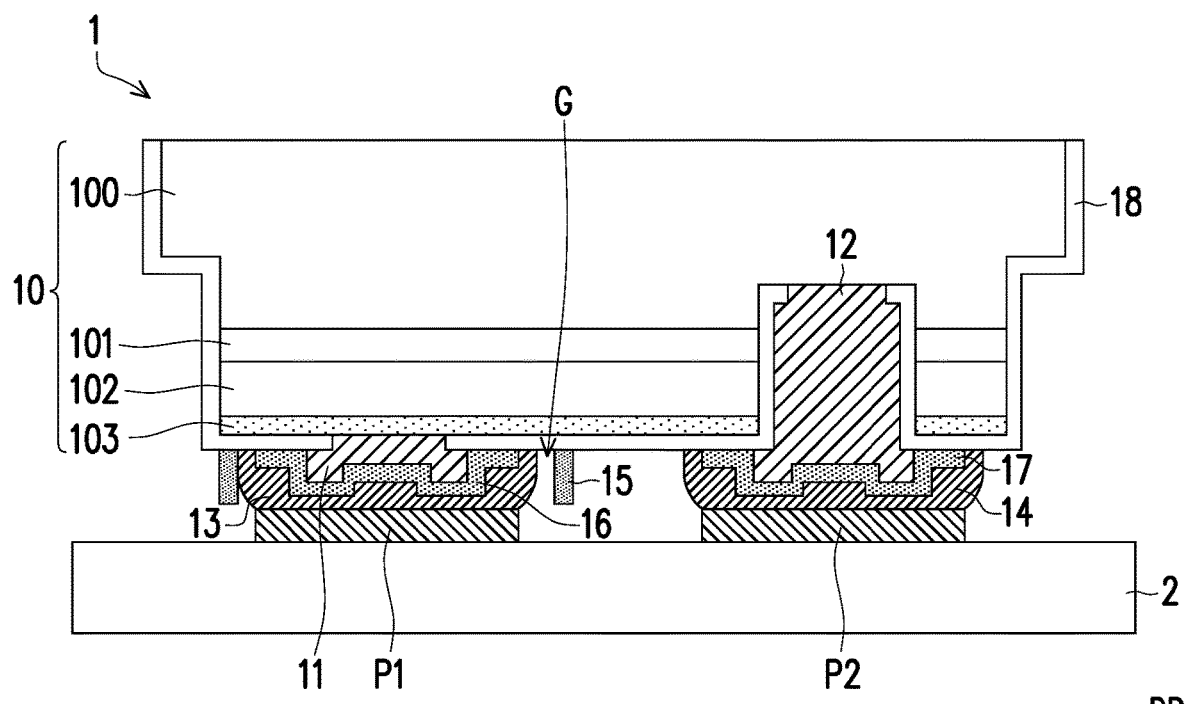
FIG. 13 is a partial schematic cross-sectional view of a display device according to an embodiment of the present disclosure.

FIG. 1A, FIG. 2A, FIG. 3A and FIG. 4 to FIG. 12 are respectively partial schematic cross-sectional views of micro element structures according to a plurality of embodiments of the disclosure. FIG. 1B, FIG. 2B and FIG. 3B are respectively partial schematic top views of the micro element structures according to a plurality of embodiments of the disclosure, where schematic cross-sectional views of FIG. 1B, FIG. 2B and FIG. 3B along a section line I-I', a section line II-II' and a section line III-III' may respectively refer to FIG. 1A, FIG. 2A and FIG. 3A. FIG. 13 is a partial schematic cross-sectional view of a display device according to an embodiment of the present disclosure.

In the embodiments shown in FIG. 1A to FIG. 13, the same or similar components may adopt the same or similar reference numerals, and descriptions thereof are not repeated. In addition, features in different embodiments may be combined under no confliction, and simple equivalent changes and modifications made in accordance with the specification or scope of the patent application are still within the scope of the patent.

Referring to FIG. 1A and FIG. 1B, a micro element structure 1 may include a body 10, two electrodes 11, 12, two solder patterns 13, 14 and a confinement structure 15, but the disclosure is not limited thereto.

In some embodiments, the micro element structure 1 is a micro light-emitting diode (LED) structure, and the body 10 may include a first type semiconductor layer 100, a light-emitting layer 101 and a second type semiconductor layer 102, but the disclosure is not limited thereto. The light-emitting layer 101 is located between the first type semiconductor layer 100 and the second type semiconductor layer 102, and the second type semiconductor layer 102 is located between the light-emitting layer 101 and the two solder patterns 13, 14.

One of the first type semiconductor layer 100 and the second type semiconductor layer 102 may be a P type semiconductor layer, and the other may be an N type semiconductor layer. Materials of the first type semiconductor layer 100 and the second type semiconductor layer 102 may include group III and group V materials, such as nitrides and alloys thereof (such as gallium nitride, aluminum nitride, indium nitride, indium gallium nitride, aluminum gallium nitride, aluminum indium gallium nitride, etc.), arsenide and alloys thereof (such as gallium arsenide, aluminum arsenide, indium arsenide, indium gallium arsenide, aluminum gallium arsenide, aluminum indium gallium arsenide, etc.), phosphide and alloys thereof (such as gallium phosphide, aluminum phosphide, indium phosphide, indium gallium phosphide, aluminum gallium phosphide, aluminum indium gallium phosphide, etc.), but the disclosure is not limited thereto. The light-emitting layer 101 may be a multiple quantum well (MQW) structure, but the disclosure is not limited thereto.

In some embodiments, the body 10 may optionally include a current diffusion layer 103, and the second type semiconductor layer 102 is located between the light-emitting layer 101 and the current diffusion layer 103. A material of the current diffusion layer 103 may include a transparent conductive material, such as metal oxide, but the disclosure is not limited thereto. The metal oxide may include indium tin oxide (ITO), but the disclosure is not limited thereto.

The two electrodes 11, 12 are disposed on a side of the body 10. For example, the electrode 11 is disposed on the current diffusion layer 103 and is electrically coupled to the second type semiconductor layer 102 through the current diffusion layer 103. The electrode 12 is disposed on the first type semiconductor layer 100 and is electrically connected to the first type semiconductor layer 100. Materials of the electrodes 11 and 12 may include metals, alloys or combinations thereof, but the disclosure is not limited thereto.

In some embodiments, the current diffusion layer 103, the second type semiconductor layer 102 and the light-emitting layer 101 may be etched through conductive via etching to expose the first type semiconductor layer 100, and the electrode 12 is then in contact with the first type semiconductor layer 100 through the conductive via. In addition, a top surface of the electrode 11 and a top surface of the electrode 12 may be flush with each other based on requirements (for example, direct bonding), but the disclosure is not limited thereto. In other embodiments, as shown in FIG. 12, the first type semiconductor layer 100 may be exposed by platform etching, so as to electrically connect the first type semiconductor layer 100 and the electrode 12.

The two solder patterns 13, 14 are respectively disposed on the two electrodes 11, 12. A material of the solder pattern 13 and the solder pattern 14 may include tin or other suitable conductive materials.

The confinement structure 15 protrudes relative to the body 10, in FIG. 1A, the confinement structure 15 surrounds one of the electrodes (the electrode 11) and the solder pattern 13 thereon. For example, an orthogonal projection P13 of the surrounded solder pattern 13 on the body 10 is completely surrounded by an orthogonal projection P15 of the confinement structure 15 on the body 10 (as shown in FIG. 1B).

In addition, at least a portion of the confinement structure 15 is separated from the surrounded solder pattern 13 with a gap G. For example, viewing from the schematic cross-sectional view of the micro element structure 1, as shown in FIG. 1, at least a portion of an inner sidewall of the confinement structure 15 (i.e. a surface of the confinement structure 15 facing the surrounded solder pattern 13) is separated from the surrounded solder pattern 13. FIG. 1A schematically shows that the inner sidewall of the confinement structure 15 is completely separated from the surrounded solder pattern 13, but the disclosure is not limited thereto. In other embodiments, as shown in FIG. 2A, the inner sidewall of the confinement structure 15 may be partially in contact with and partially separated from the solder pattern 13, for example, a lower region of the inner sidewall of the confinement structure 15 on the left side may be in contact with the solder pattern 13, while an upper region of the inner sidewall is in separated from the solder pattern 13. On the other hand, at least a portion of the inner sidewall of the confinement structure 15 is separated from the surrounded solder pattern 13. As shown in the schematic top view of FIG. 1B, the inner sidewall of the confinement structure 15 is completely separated from the surrounded solder pattern 13. In other embodiments, as shown in FIG. 2B, at least one side of the inner sidewall of the confinement structure 15 may be in contact with the solder pattern 13, and the other sides of the inner sidewall of the confinement structure 15 may be separated from the solder pattern 13.

By surrounding the electrode 11 and the solder pattern 13 thereon through the confinement structure 15, an overflow range of the solder pattern 13 during a reflow process may be limited, so as to prevent contact and short circuit of the overflowing solder pattern 13 and the overflowing solder pattern 14. In addition, by maintaining a distance (i.e. the gap G) between the confinement structure 15 and the solder pattern 13, a range enclosed by the confinement structure 15 for confining the overflowing solder pattern 13 may be effectively solidified or reduced, which helps to further reduce a probability of short circuit.

In some embodiments, based on reliability or process considerations, an end portion E15 of the confinement structure 15 is designed to be located between a top portion T13 of the solder pattern 13 and a bottom portion B13 of the solder pattern 13. The end portion E15 of the confinement structure 15 refers to an end of the confinement structure 15 away from the body 10. The top portion T13 of the solder pattern 13 refers to a surface of the solder pattern 13 farthest from the body 10, and the bottom portion B13 of the solder pattern 13 refers to a surface of the solder pattern 13 closest to the body 10. The end portion E15 of the confinement structure 15 is higher than the bottom portion B13 of the solder pattern 13 to reduce the probability of overflow, and the end portion E15 is lower than the top portion T13 of the solder pattern 13 to prevent compression deformation or fracture of the confinement structure 15 when the micro element structure 1 is bonded to a circuit substrate (not shown).

In some embodiments, a ratio of a width WG of the gap G to a thickness TH13 of the surrounded solder pattern 13 (such as a thickness at a protruding portion PP of the solder pattern 13) is greater than or equal to 0.25. Here, the width WG and the thickness TH13 may be respectively regarded as factors related to an accommodation space of the gap G and a volume of the solder pattern 13. In other words, the above-mentioned ratio higher than 0.25, for example, indicates that the gap G has a relatively large space for accommodating the solder pattern 13, which may better prevent the solder pattern 13 from overflowing a confinement area thereof. Moreover, a protrusion height H15 of the confinement structure 15 relative to the body 10 may be 0.1 μm to 0.5 μm, for example, 0.3 μm or more. However, the protrusion height H15 may be varied according to other design parameters (such as the thickness TH13 of the solder pattern 13, the material or manufacturing method of the confinement structure 15, etc.), therefore the disclosure is not limited thereto.

In addition, although FIG. 1A schematically illustrates the confinement structure 15, the confinement structure 15 surrounds the electrode 11, an eutectic barrier pattern 16, and the solder pattern 13, and a cross-sectional shape of the confinement structure 15 is a rectangle, it should be understood that design parameters such as the number of the confinement structures 15, a configuration position and a cross-sectional shape of the confinement structure 15, etc., may be changed according to actual needs. For example, in other embodiments, the number of the confinement structures 15 may be plural, and the plurality of confinement structures 15 may respectively surround a plurality of electrode patterns. For example, the confinement structure 15 may also surround the electrode 12, an eutectic barrier pattern 17 and the solder pattern 14. In addition, the cross-sectional shape of the confinement structure 15 may include a horn shape, a triangle, a quadrilateral, a circular convex shape, a bent shape or an irregular shape. The quadrilateral may include, but not limited to, a rectangle, a square, or a trapezoid, etc., but the disclosure is not limited thereto.

Moreover, according to different needs, the micro element structure 1 may optionally include other elements or film layers. For example, in some embodiments, although not shown, the micro element structure 1 may be an epitaxial structure formed on an epitaxial substrate. A material of the substrate may include sapphire, gallium nitride, gallium arsenide, silicon, silicon germanium, glass, ceramic, silicon carbide, aluminum nitride or other suitable materials. Alternatively, after the above-mentioned elements and film layers are formed on the substrate, the substrate may be selectively removed, for example, the substrate may be separated from the elements and film layers thereon through a laser lift-off (LLO) process.

In some embodiments, the micro element structure 1 may include two eutectic barrier patterns (such as the eutectic barrier pattern 16 and the eutectic barrier pattern 17), which are respectively located between the electrode 11 and the solder pattern 13 located thereon, and between the electrode 12 and the solder pattern 14 located thereon. The two electrodes may be sealed by the two eutectic barrier patterns and separated from the two solder patterns, so as to prevent eutectic generated during a subsequent reflow process, thereby helping to improve an electrical performance and structure reliability of the micro element structure 1. The materials of the eutectic barrier pattern 16 and the eutectic barrier pattern 17 may include nickel, platinum, titanium or alloys thereof or a transparent conductive material, but the disclosure is not limited thereto.

In some embodiments, two electrodes, two eutectic barrier patterns and two solder patterns may be sequentially stacked conformally on the body 10. Since the electrodes 11, 12 are in a recessed shape by partially etching the micro element structure 1, each solder pattern may form a groove GR on the side away from the body 10 due to conformal stacking, which means that a portion of the solder pattern is accommodated in the grooves of the electrodes 11, 12, thereby reducing a degree of overflow.

Each solder pattern may further have a protruding portion PP surrounding the groove GR. The gap G at the periphery of the solder pattern 13 is a recessed section relative to the protruding portion PP, and the recessed section may accommodate a portion of the solder when the solder pattern overflows, thereby reducing the degree of overflow.

In some embodiments, the micro element structure 1 may include an insulating layer 18. The insulating layer 18, for example, covers the body 10 and has two openings A. The two electrodes (such as the electrode 11 and the electrode 12) are disposed on the insulating layer 18 and respectively connected to the body 10 through the two openings A. In some embodiments, the confinement structure 15 is disposed on the insulating layer 18, and the confinement structure 15 and the insulating layer 18 may be made of a same material or different materials. For example, the material of the insulating layer 18 may include silicon oxide ($Si_xO_y$) or titanium dioxide, but the disclosure is not limited thereto. In the case that the confinement structure 15 and the insulating layer 18 are made of the same material, the confinement structure 15 and the insulating layer 18 may be integrally formed, but the disclosure is not limited thereto.

Referring to FIG. 2A and FIG. 2B, main differences between a micro element structure 1A and the micro element structure 1 in FIG. 1A and FIG. 1B are described as follows. In the micro element structure 1A, at least one side of the inner sidewall of the confinement structure 15 is in contact with the solder pattern 13, and the other sides of the inner sidewall of the confinement structure 15 are separated from the solder pattern 13. In any embodiment of the disclosure, the relative arrangement relationship between the confinement structure and the surrounded solder pattern may all have the same change, which will not be repeated below.

Figure 3A:
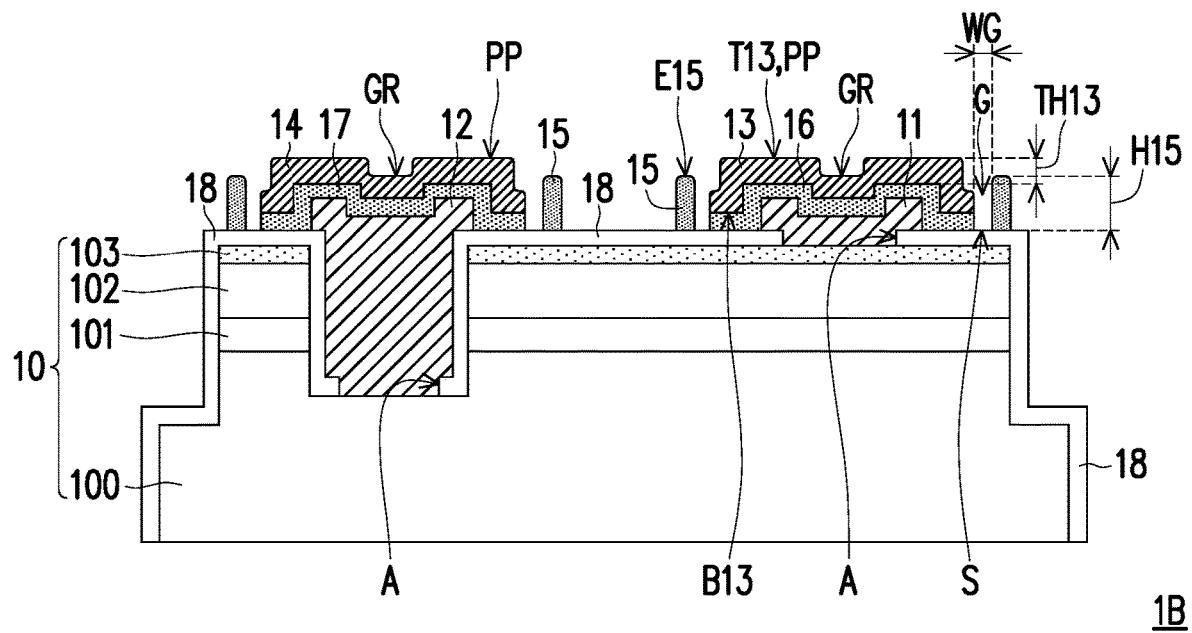
Figure 3B:
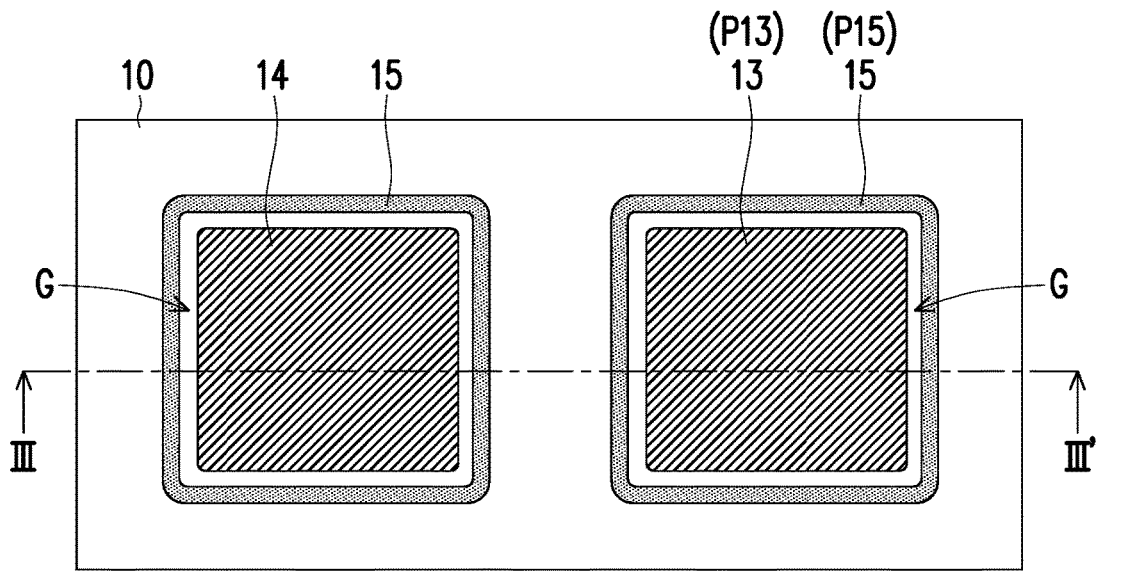

Referring to FIG. 3A and FIG. 3B, main differences between a micro element structure 1B and the micro element structure 1 in FIG. 1A and FIG. 1B are described below. The micro element structure 1B includes two confinement structures 15, and the two confinement structures 15 respectively surround the solder pattern 13 and the solder pattern 14. The number of the confinement structures 15 may be changed according to different requirements. In any embodiment of the disclosure, the number of the confinement structures 15 may be one or two, which will not be repeated below.

Figure 4:
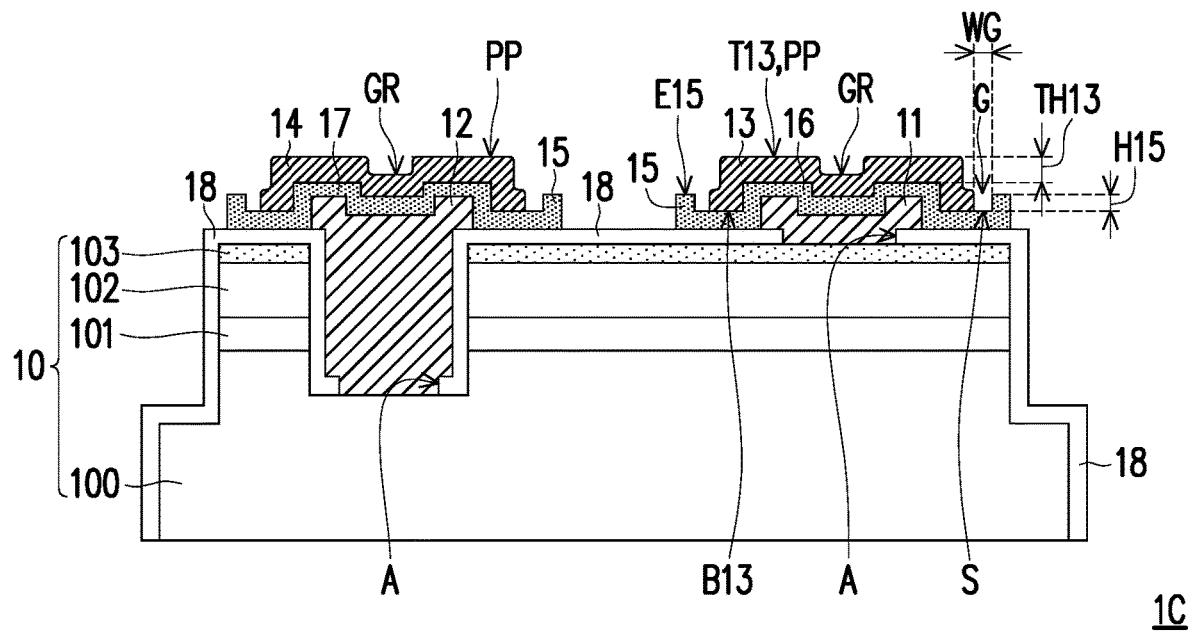

Referring to FIG. 4, main differences between a micro element structure 1C and the micro element structure 1B of FIG. 3A are described below. In the micro element structure 1B of FIG. 3A, the confinement structure 15 is disposed on the insulating layer 18 and keeps a distance from the eutectic barrier pattern 16 (or the eutectic barrier pattern 17) being surrounded; in the micro element structure 1C of FIG. 4, the solder pattern 13 (or the solder pattern 14) exposes a peripheral portion of the eutectic barrier pattern 16 (or the eutectic barrier pattern 17) located thereunder, and the confinement structure 15 is set on the peripheral portion of the eutectic barrier pattern 16 (or the eutectic barrier pattern 17) and protrudes relative to the peripheral portion. For example, in FIG. 4, the confinement structure 15 and the eutectic barrier pattern 16 (or the eutectic barrier pattern 17) may be integrally formed, i.e., the confinement structure 15 and the eutectic barrier pattern 16 (or the eutectic barrier patterns 17) may have a same material. In other embodiments, the confinement structure 15 and the eutectic barrier pattern 16 (or the eutectic barrier pattern 17) may have different materials.

Figure 5:
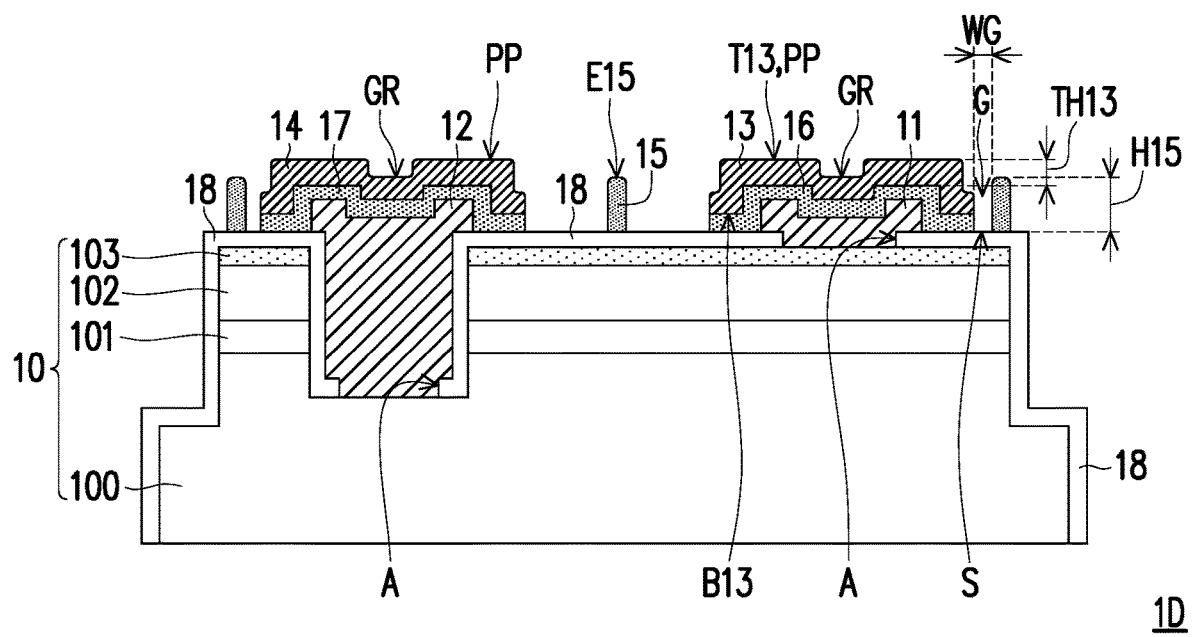

Referring to FIG. 5, a main difference between a micro element structure 1D and the micro element structure 1C in FIG. 4 is described as follows. In the micro element structure 1C of FIG. 4, the solder pattern 13 and the solder pattern 14 are separated by two confinement structures 15. In the micro element structure 1D of FIG. 5, the solder pattern 13 and the solder pattern 14 are separated by one confinement structure 15, i.e., there is only one barrier (the confinement structure 15) between the solder pattern 13 and the solder pattern 14.

Figure 6:
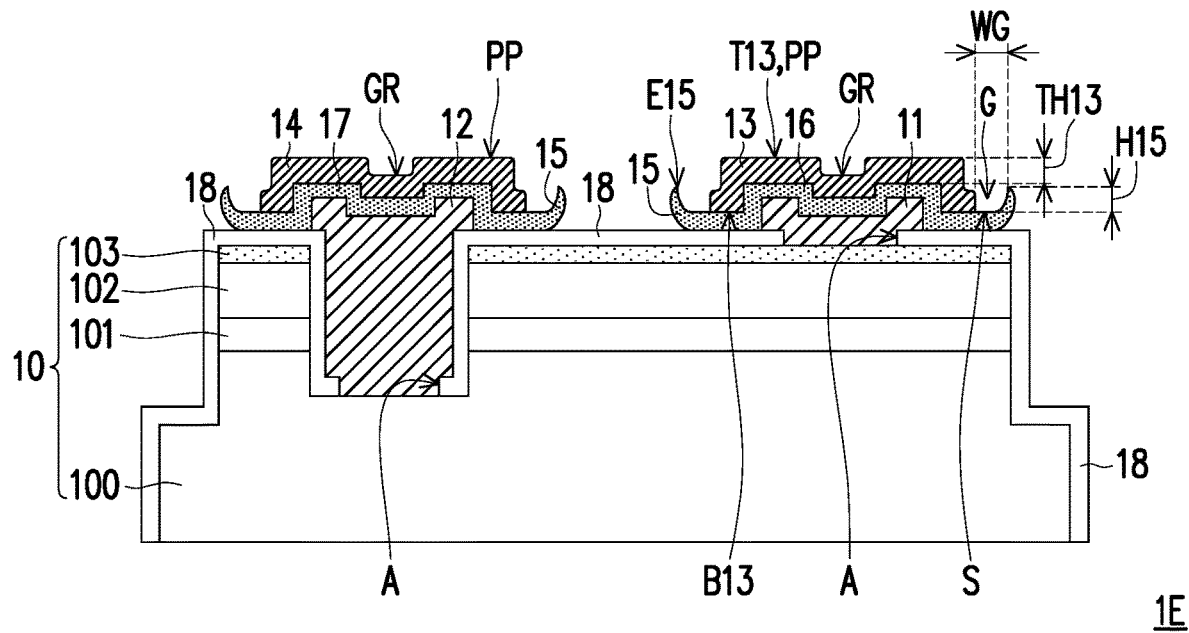

Referring to FIG. 6, a main difference between a micro element structure 1E and the micro element structure 1C of FIG. 4 are described below. In the micro element structure 1E, a cross-sectional shape of the confinement structure 15 is, for example, a horn shape.

Figure 7:
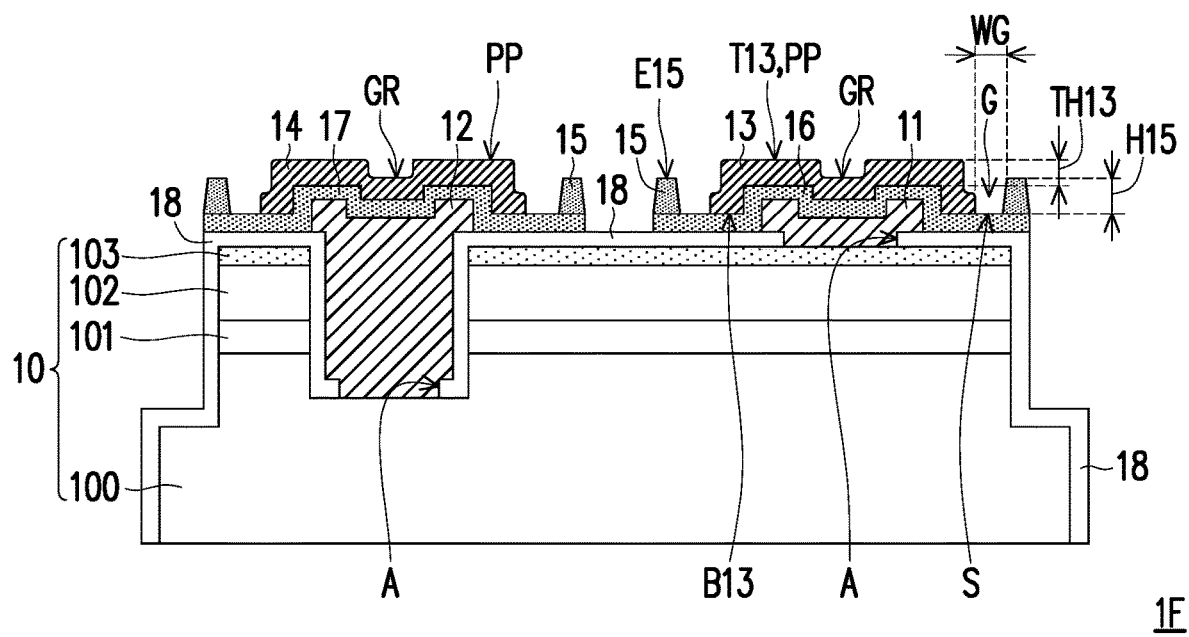

Referring to FIG. 7, main differences between a micro element structure 1F and the micro element structure 1C of FIG. 4 are described below. In the micro element structure 1F, a cross-sectional shape of the confinement structure 15 is, for example, a trapezoid. In addition, the confinement structure 15 and the eutectic barrier pattern 16 (or the eutectic barrier pattern 17), for example, have different materials.

Figure 8:
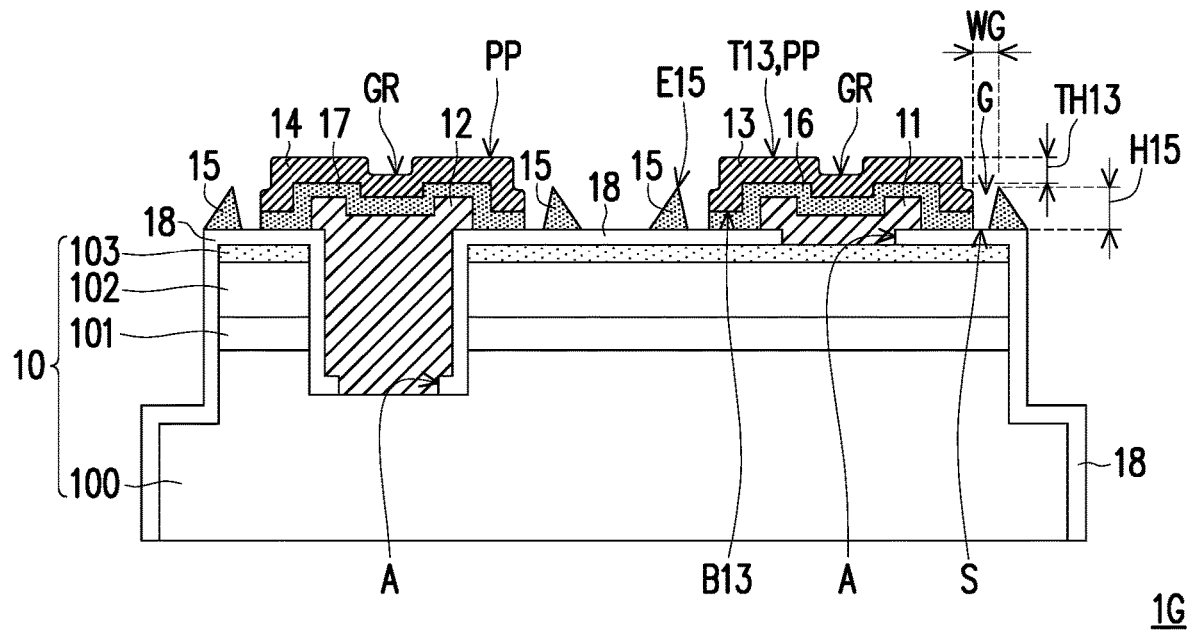

Referring to FIG. 8, a main difference between a micro element structure 1G and the micro element structure 1B of FIG. 3A is described below. In the micro element structure 1G, a cross-sectional shape of the confinement structure 15 is, for example, a triangle.

Figure 9:
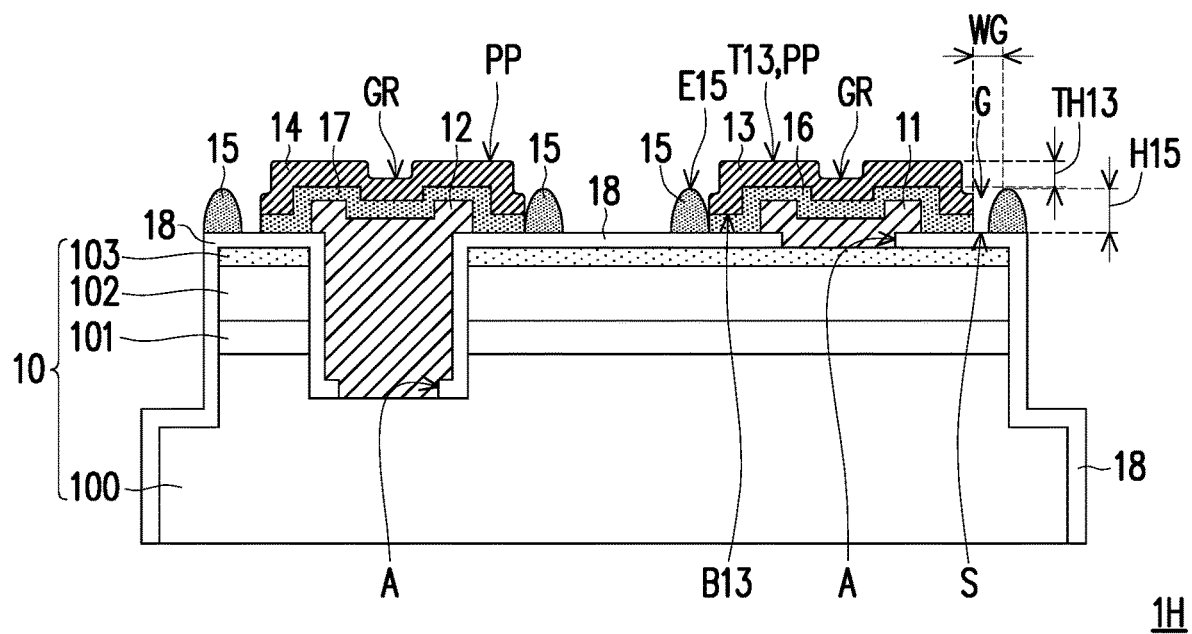

Referring to FIG. 9, a main difference between a micro element structure 1H and the micro element structure 1G of FIG. 8 is described below. In the micro element structure 1H, a cross-sectional shape of the confinement structure 15 is, for example, a circular convex shape.

Figure 10:
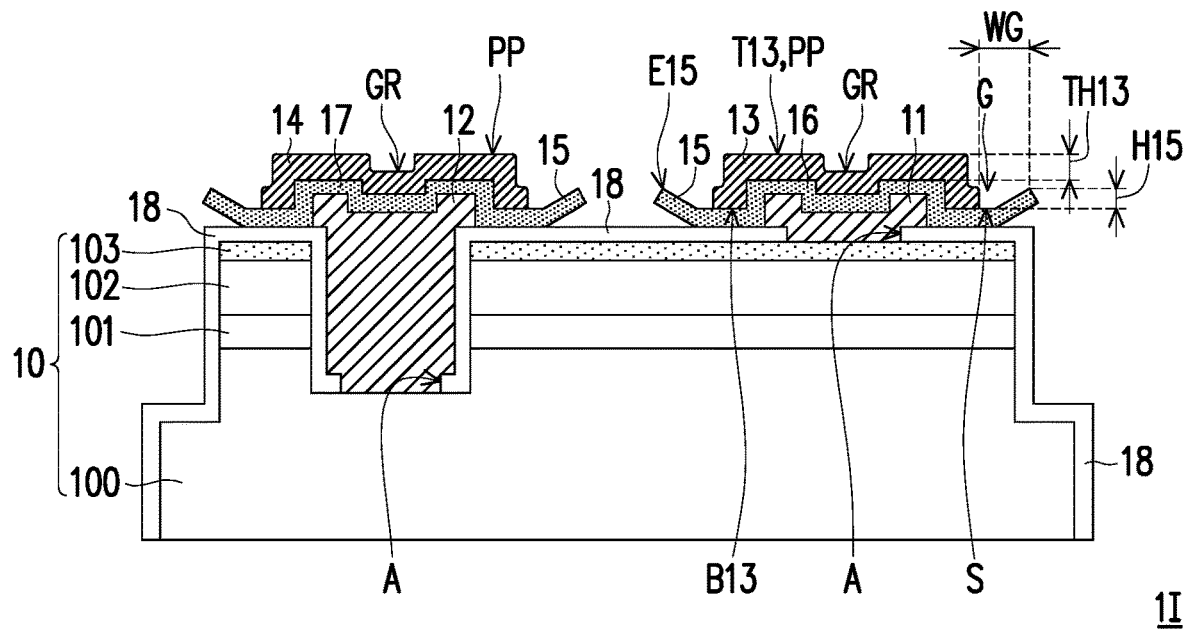

Referring to FIG. 10, a main difference between a micro element structure 1I and the micro element structure 1E of FIG. 6 is described below. In the micro element structure 1I, a cross-sectional shape of the confinement structure 15 is, for example, a bent shape.

Referring to FIG. 11, a main difference between a micro element structure 1J and the micro element structure 1F of FIG. 7 is described below. In the micro element structure 1J, a cross-sectional shape of the confinement structure 15 is, for example, an irregular shape.

Referring to FIG. 12, a main difference between a micro element structure 1K and the micro element structure 1C of FIG. 4 is described below. In the micro element structure 1K, the first type semiconductor layer 100 is exposed by platform etching, so as to realize electrical connection between the first type semiconductor layer 100 and the electrode 12, but the disclosure is not limited thereto. Any embodiment of the disclosure may also have a same change, and detail thereof is not repeated.

Referring to FIG. 13, a display device DD may include a circuit substrate 2 and the micro element structure 1. The circuit substrate 2 may include a complementary metal-oxide-semiconductor (CMOS) substrate, a liquid crystal on silicon (LCOS) substrate, a thin film transistor (TFT) substrate or other substrates with a working circuit, which is not limited by the disclosure. In addition, the circuit substrate 2 may include a pad P1 and a pad P2, but the disclosure is not limited thereto.

The micro element structure 1 is disposed on the circuit substrate 2 and is electrically connected to the circuit substrate 2. For example, the solder pattern 13 and the solder pattern 14 in the micro element structure 1 may be respectively soldered together with the pad P1 and the pad P2 in the circuit substrate 2 through a reflow process. Under this framework, the two electrodes 11, 12 are disposed on a side of the body 10 facing the circuit substrate 2, and the two solder patterns 13, 14 are located between the two electrodes and the circuit substrate 2.

In other embodiments, although not shown, the micro element structure 1 in the display device DD may be replaced with the micro element structure of any one of the above-mentioned embodiments, which will not be repeated here.

Moreover, although 13 schematically illustrates one micro element structure, the display device DD may include multiple micro element structures, including but not limited to blue, red or green micro LED structures.

In summary, in the embodiment of the disclosure, by surrounding the electrodes and the solder patterns thereon with the confinement structure, the overflow range of the solder patterns during the reflow process may be confined, so as to prevent the overflowing solder pattern from contacting with the overflowing solder pattern to cause a short circuit. In addition, by maintaining a distance (gap) between the confinement structure and the solder pattern, the range enclosed by the confinement structure for confining the overflowing solder pattern may be effectively solidified or reduced, which helps to further reduce a probability of the short circuit.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A micro element structure, comprising:
    a body;
    two electrodes, disposed on a side of the body;
    two solder patterns, respectively disposed on the two electrodes;
    a confinement structure, protruding relative to the body, wherein the confinement structure surrounds one of the electrodes and the solder pattern thereon, and at least a portion of the confinement structure is separated from the surrounded solder pattern with a gap; and
    an insulating layer, covering the body and having two openings, wherein the two electrodes are disposed on the insulating layer and are respectively connected to the body through the two openings, and the confinement structure is disposed on the insulating layer.

2. The micro element structure according to claim 1, further comprising:
    two eutectic barrier patterns, respectively located between one of the electrodes and the solder pattern thereon and between the other one of the electrodes and the solder pattern thereon.

3. The micro element structure according to claim 2, wherein:
    one of the solder patterns exposes a peripheral portion of the eutectic barrier pattern located thereunder, and the confinement structure is disposed on the peripheral portion of the eutectic barrier pattern and protrudes relative to the peripheral portion.

4. The micro element structure according to claim 3, wherein the confinement structure and the eutectic barrier pattern are integrally formed.

5. The micro element structure according to claim 3, wherein the confinement structure and the eutectic barrier pattern have different materials.

6. The micro element structure according to claim 2, wherein the two electrodes are respectively sealed by the insulating layer and the two eutectic barrier patterns to separate from the two solder patterns.

7. The micro element structure according to claim 1, wherein the confinement structure and the insulating layer are integrally formed, or the confinement structure and the insulating layer have different materials.

8. The micro element structure according to claim 1, further comprising:
two eutectic barrier patterns, wherein the two electrodes, the two eutectic barrier patterns, and the two solder patterns are sequentially stacked conformally on the body, and each of the solder patterns has a groove on a side away from the body.

9. The micro element structure according to claim 1, wherein an end portion of the confinement structure is located between a top portion of the solder pattern and a bottom portion of the solder pattern.

10. The micro element structure according to claim 1, wherein an orthogonal projection of the surrounded solder pattern on the body is completely surrounded by an orthogonal projection of the confinement structure on the body.

11. The micro element structure according to claim 1, wherein a ratio of a width of the gap to a thickness of the surrounded solder pattern is greater than or equal to 0.25.

12. The micro element structure according to claim 1, wherein a protrusion height of the confinement structure relative to the body is 0.1 µm to 0.5 µm.

13. The micro element structure according to claim 1, wherein a cross-sectional shape of the confinement structure comprises a horn shape, a triangle, a quadrilateral, a circular convex shape, or a bent shape.

14. A display device, comprising:
a circuit substrate; and
a plurality of micro element structures, disposed on the circuit substrate and electrically connected to the circuit substrate, wherein each of the micro element structures comprises:
a body;
two electrodes, disposed on a side of the body facing the circuit substrate;
two solder patterns, respectively disposed on the two electrodes and located between the two electrodes and the circuit substrate;
a confinement structure, protruding relative to the body, wherein the confinement structure surrounds one of the electrodes and the solder pattern thereon, and at least a portion of the confinement structure is separated from the surrounded solder pattern with a gap; and
an insulating layer, covering the body and having two openings, wherein the two electrodes are disposed on the insulating layer and are respectively connected to the body through the two openings, and the confinement structure is disposed on the insulating layer.

15. The display device according to claim 14, wherein the confinement structure has an end portion, the solder pattern has a top portion away from the body and a bottom portion close to the body, and the end portion is located between the top portion and the bottom portion.

16. The display device according to claim 14, wherein an orthogonal projection of the confinement structure on the body completely covers an orthogonal projection of the surrounded solder pattern on the body.

\* \* \* \* \*